US011681929B2

(12) United States Patent
Strong

(10) Patent No.: US 11,681,929 B2
(45) Date of Patent: Jun. 20, 2023

(54) METHODS AND SYSTEMS FOR PREDICTING A REMAINING USEFUL LIFE OF A COMPONENT USING AN ACCELERATED FAILURE TIME MODEL

(71) Applicant: Honeywell International Inc., Morris Plains, NJ (US)

(72) Inventor: Eric Allen Strong, Gilbert, AZ (US)

(73) Assignee: Honeywell International Inc., Charlotte, NC (US)

(*) Notice: Subject to any disclaimer, the term of this patent is extended or adjusted under 35 U.S.C. 154(b) by 0 days.

(21) Appl. No.: 16/149,668

(22) Filed: Oct. 2, 2018

(65) Prior Publication Data

US 2020/0104730 A1    Apr. 2, 2020

(51) Int. Cl.

| G06N 5/04 | (2006.01) |
|---|---|
| G06N 20/00 | (2019.01) |
| G06F 30/20 | (2020.01) |
| G07C 5/00 | (2006.01) |
| G07C 5/08 | (2006.01) |
| G01N 17/00 | (2006.01) |

(52) U.S. Cl.
CPC ............ *G06N 5/04* (2013.01); *G06F 30/20* (2020.01); *G06N 20/00* (2019.01); *G07C 5/006* (2013.01); *G07C 5/0808* (2013.01); *G01N 17/00* (2013.01)

(58) Field of Classification Search
USPC ........................................................ 701/29.4
See application file for complete search history.

(56) References Cited

U.S. PATENT DOCUMENTS

| 6,490,543 B1 | 12/2002 | Jaw |
|---|---|---|
| 8,275,642 B2 | 9/2012 | Chan et al. |

(Continued)

FOREIGN PATENT DOCUMENTS

| CN | 101963937 A | 2/2011 |
|---|---|---|
| CN | 104049628 A | 9/2014 |

(Continued)

OTHER PUBLICATIONS

Pramod Bangalore,An Artificial Neural Network Approach for Early Fault Detection of Gearbox Bearings, (1949-3053 c 2015 IEEE.https://ieeexplore.ieee.org/stamp/stamp.jsp?tp=&arnumber=7012091)(2015).*

(Continued)

*Primary Examiner* — Jean Paul Cass
(74) *Attorney, Agent, or Firm* — Bookoff McAndrews, PLLC

(57) ABSTRACT

Systems and methods are disclosed for predicting a remaining useful life of a component. One method comprises receiving, by a component prediction system, one or more component data sets associated with one or more components of a moving object. Based on the received one or more component data sets, environmental and operational conditions experienced over a lifetime of each failed component may be identified and summarized. Then, the effects of the environmental and operational conditions on a lifetime of a component of interest may be determined by training an accelerated failure time model using the summarized environmental and operational conditions. Using the trained accelerated failure time model, a remaining useful life of the component of interest may be determined.

20 Claims, 5 Drawing Sheets

(56) References Cited

U.S. PATENT DOCUMENTS

| | | | |
|---|---|---|---|
| 8,296,107 B2 | 10/2012 | Turner et al. | |
| 8,452,475 B1 | 5/2013 | West et al. | |
| 9,459,018 B2* | 10/2016 | Fadell | G08B 29/02 |
| 2005/0114088 A1* | 5/2005 | Gorden | G01M 15/05 |
| | | | 702/185 |
| 2005/0192727 A1* | 9/2005 | Shostak | G07C 5/0808 |
| | | | 701/1 |
| 2005/0273277 A1* | 12/2005 | Ridnour | G01M 17/007 |
| | | | 702/42 |
| 2008/0284575 A1* | 11/2008 | Breed | B60N 2/2863 |
| | | | 701/31.4 |
| 2009/0265118 A1 | 10/2009 | Guenther et al. | |
| 2009/0327169 A1* | 12/2009 | Kamar | G06Q 10/109 |
| | | | 706/46 |
| 2011/0178831 A1* | 7/2011 | Ravichandran | H04L 67/02 |
| | | | 705/7.11 |
| 2013/0232094 A1* | 9/2013 | Anderson | G05B 23/0281 |
| | | | 706/12 |
| 2013/0282355 A1 | 10/2013 | Hosking et al. | |
| 2013/0283104 A1* | 10/2013 | Hosking | G06Q 10/109 |
| | | | 714/E11.179 |
| 2015/0198492 A1 | 7/2015 | Dion et al. | |
| 2017/0070842 A1* | 3/2017 | Kulp | H04L 67/62 |
| 2018/0046924 A1* | 2/2018 | Huang | G06N 20/10 |
| 2018/0284735 A1* | 10/2018 | Cella | G05B 23/0264 |
| 2019/0012851 A1* | 1/2019 | Korchev | G07C 5/0808 |
| 2019/0257658 A1* | 8/2019 | Wang | G01C 21/26 |
| 2019/0324431 A1* | 10/2019 | Cella | G06N 7/005 |
| 2019/0391800 A1* | 12/2019 | Lin | H04L 67/34 |
| 2020/0006100 A1* | 1/2020 | Clark | H01L 22/12 |
| 2020/0055421 A1* | 2/2020 | Sastinsky | H04L 67/10 |
| 2020/0083080 A1* | 3/2020 | Clark | H01L 21/67225 |
| 2020/0103894 A1* | 4/2020 | Cella | G06N 3/088 |
| 2020/0125083 A1* | 4/2020 | Yu | G06N 20/10 |
| 2020/0250944 A1* | 8/2020 | Griffis | G08B 13/19636 |
| 2020/0301408 A1* | 9/2020 | Elbsat | G05B 23/0291 |
| 2020/0348662 A1* | 11/2020 | Cella | G05B 23/0286 |
| 2020/0356087 A1* | 11/2020 | Elbsat | G05B 23/0254 |

FOREIGN PATENT DOCUMENTS

| | | |
|---|---|---|
| CN | 104537133 A | 4/2015 |
| CN | 104637021 A | 5/2015 |
| CN | 106951695 A | 7/2017 |
| CN | 108053079 A | 5/2018 |
| CN | 108327721 A | 7/2018 |
| CN | 108549943 A | 9/2018 |
| CN | 108549951 A | 9/2018 |
| CN | 108600954 A | 9/2018 |
| EP | 2472457 A1 | 7/2012 |
| TW | 200741565 A | 11/2007 |

OTHER PUBLICATIONS

Extended European Search Report dated Feb. 14, 2020 in corresponding EP Application No. 19200307.7 (9 pages).

* cited by examiner

METHODS AND SYSTEMS FOR PREDICTING A REMAINING USEFUL LIFE OF A COMPONENT USING AN ACCELERATED FAILURE TIME MODEL

TECHNICAL FIELD

The present disclosure relates to methods and systems for computer-implemented mechanical component maintenance service. Particularly, the present disclosure relates to methods and systems for predicting a remaining useful life of mechanical components exposed to environmental and operational factors, and updating and managing maintenance schedules based on the predicted remaining useful life.

BACKGROUND

In the context of vehicles carrying multiple passengers (e.g., a public or private transport), accurate prediction of remaining useful life for vehicle components is important to decrease operational disruptions such as delays and cancellations, reduce unplanned maintenance costs, improve passenger experience, and reduce on-hand spare parts inventory. Accurate prediction of remaining useful life allows maintenance to be scheduled at the most suitable time before failure, preventing or mitigating the effects of failure.

Traditional reliability engineering methods identify optimal maintenance schedules (e.g., component repairs or replacements) based on the operational hours that a component has accumulated. Recently, machine learning, data-driven methods use on-vehicle (i.e., onboard) sensors and other related information to predict imminent component failures. However, these methods primarily rely on sensor data, which requires hardware installations on vehicles and do not work in the event of sensor failures or malfunction.

Therefore, there is a need for a method to accurately predict the remaining useful life of vehicle components based on other sources of information that are unique to each vehicle type, in the absence of sensor data. In particular, there is a need for a method to accurately predict the remaining useful life of vehicle components based on environmental and operational factors, and to schedule maintenance activities accordingly in advance of vehicle component failures.

The background description provided herein is for the purpose of generally presenting the context of the disclosure. Unless otherwise indicated herein, the materials described in this section are not prior art to the claims in this application and are not admitted to be prior art, or suggestions of the prior art, by inclusion in this section.

SUMMARY OF THE DISCLOSURE

One embodiment provides a computer implemented method for predicting a remaining useful life of a component, the method comprising: receiving, by a component life prediction system, one or more component data sets associated with one or more components of a moving object; for each failed component of the one or more components, summarizing, by the component life prediction system, environmental conditions and operational conditions experienced over a lifetime of the failed component; determining, by the component life prediction system, effects of the environmental conditions and the operational conditions on a lifetime of a component of interest using an accelerated failure time model and the summarized environmental and operational conditions; and determining, by the component life prediction system, a remaining useful life of the component of interest based on the accelerated failure time model.

One embodiment provides a system for predicting a remaining useful life of a component. The system may comprise one or more processors; and a non-transitory computer readable medium storing instructions that, when executed by the one or more processors, cause the one or more processors to perform a method of predicting a remaining useful life of a component, the method comprising: receiving, by a component life prediction system, one or more component data sets associated with one or more components of a moving object; for each failed component of the one or more components, summarizing, by the component life prediction system, environmental conditions and operational conditions experienced over a lifetime of the failed component; determining, by the component life prediction system, effects of the environmental conditions and the operational conditions on a lifetime of a component of interest using an accelerated failure time model and the summarized environmental and operational conditions; and determining, by the component life prediction system, a remaining useful life of the component of interest based on the accelerated failure time model.

One embodiment provides a non-transitory computer readable medium for predicting a remaining useful life of a component. The non-transitory computer readable medium may store instructions that, when executed by one or more processors, cause the one or more processors to perform a method of predicting a remaining useful life of a component comprising: receiving, by a component life prediction system, one or more component data sets associated with one or more components of a moving object; for each failed component of the one or more components, summarizing, by the component life prediction system, environmental conditions and operational conditions experienced over a lifetime of the failed component; determining, by the component life prediction system, effects of the environmental conditions and the operational conditions on a lifetime of a component of interest using an accelerated failure time model and the summarized environmental and operational conditions; and determining, by the component life prediction system, a remaining useful life of the component of interest based on the accelerated failure time model.

BRIEF DESCRIPTION OF THE DRAWINGS

Embodiments of the invention will now be described, by way of example only, with reference to the accompanying drawings in which.

DETAILED DESCRIPTION

Figure 1:
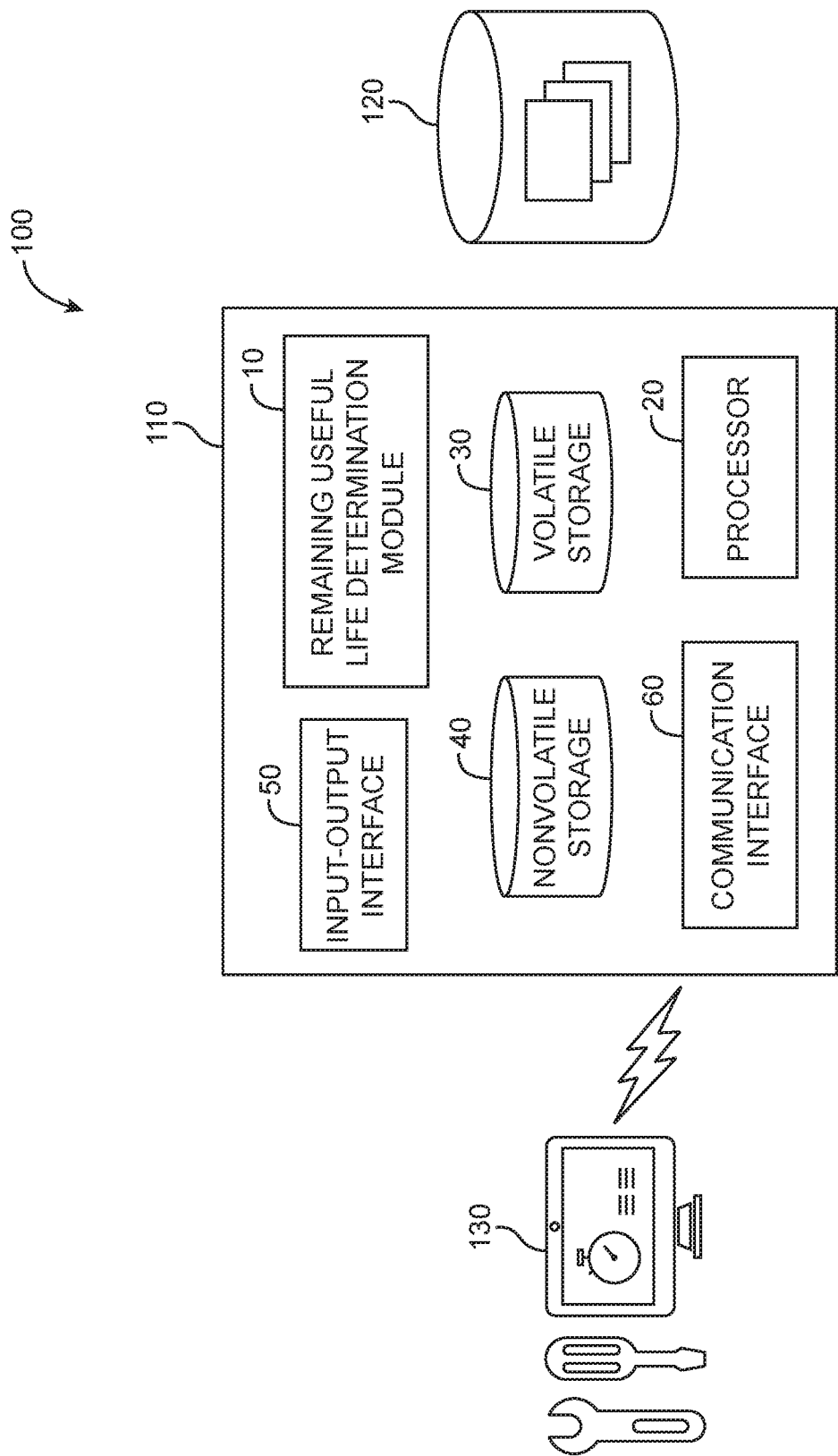
FIG. 1 illustrates an exemplary embodiment of a component life prediction and maintenance system, according to one implementation of the current disclosure.

The following embodiments describe systems and methods for predicting a remaining useful life of mechanical components exposed to environmental and operational factors, and updating and managing maintenance schedules based on the predicted remaining useful life.

The technical benefits of the current disclosure are increased accuracy of remaining useful life prediction for vehicle components without necessitating sensor coverage, which may result in decreased disruptions and unplanned failures. By including environmental (e.g. weather, temperature, etc.) and operational (e.g. travel schedules/durations, etc.) factors which other models do not consider, the accuracy of diagnostic and prognostic models developed using the current disclosure may be substantially higher than the traditional approaches.

First, the travel schedule history (i.e., operational data) per component may be cross-referenced with environmental data (e.g., weather, temperature, etc.) that occurred during each trip, which defines the environmental conditions that the component has experienced over its lifetime. For each failed component, this history may be summarized by calculating the typical (i.e., average) environmental conditions experienced by the component. The failure time for each component, for which root cause failure analysis may be performed, may be associated with the summarized environmental conditions. Then, using an Accelerated Failure Time (AFT) model, the effects of environmental conditions on component lifetime may be assessed. Using the constructed AFT model, the remaining useful life of an operating component may be predicted based on the typical environmental conditions it has experienced during its lifetime, which may reduce the effective life of the component.

One advantage of using an AFT model over more traditional reliability methods, such as a Proportional Hazard Model (PHM), is that the AFT model is parallelizable. As such, the AFT model approach is usable on "big data" architecture with a very large number of vehicles, with increased speed and efficiency of model development compared to other methods.

Subject matter will now be described more fully hereinafter with reference to the accompanying drawings, which form a part hereof, and which show, by way of illustration, specific exemplary embodiments. An embodiment or implementation described herein as "exemplary" is not to be construed as preferred or advantageous, for example, over other embodiments or implementations; rather, it is intended reflect or indicate that the embodiment(s) is/are "example" embodiment(s). Subject matter be embodied in a variety of different forms and, therefore, covered or claimed subject matter is intended to be construed as not being limited to any exemplary embodiments set forth herein; exemplary embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware, or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of exemplary embodiments in whole or in part.

Referring now to the appended drawings, FIG. 1 shows an exemplary embodiment of a component life prediction and maintenance system 100. In general, the component life prediction and management system 100 comprises a component life prediction system 110, a component data database 120, and a component maintenance system 130.

In FIG. 1, component life prediction system 110 may be any type of computer system including a processor 20, a volatile storage 30 (e.g., memory such as RAM), a nonvolatile storage 40 (e.g. ROM and/or hard drive), a remaining useful life determination module 10, an input/output interface 50, and a communication interface 60. Remaining useful life determination module 10 may be "loaded" (i.e., transferred from nonvolatile storage 40 to volatile storage 30) for execution by the processor 20 and when executed, may estimate or predict a remaining useful life (RUL) of a component. Input/out interface 50 may enable the component life prediction system 110 to connect with input and output devices such as keyboard, mice, touchscreens, monitors, displays, USB, flash memory, etc. Software and firmware updates may be received and installed via the input interface. User commands (to control settings and configurations of the component life prediction system 110) and user-provided data may also be received via the input interface. Further, processed data such as, e.g., remaining useful life of a component, may be displayed on display devices connected via the output interface, or transmitted and stored on storage devices connected via the output interface. Component life prediction system 110 may also include communication interface 60. Communication interface 60 may allow data to be transmitted between the component data database 120 and the component life prediction system 110. For example, the component life prediction system 110 may receive environmental and operational data associated with components from the component data database 120 via the communication interface 60. Communication interface 60 may also allow data to be transmitted between the component maintenance system 130 and the component life prediction system 110. For example, the component maintenance system 130 may be connected to the component life prediction system 110 via the communication interface 60, and may display data received from the component life prediction system 110. Further, a user or an administrator of the component life prediction system 110 may use a computer or a mobile device (e.g., cellular phone, tablet, laptop, portable device, etc.) to connect to the component life prediction system 110 via the communication interface 60, and may control settings and configurations of the component life prediction system 110, as well as view status, results, and notifications generated by the component life prediction system 110. Data may be transmitted in the form of signals, which may be electronic, electromagnetic, optical, or other signals capable of being received by the communication interface 60. These signals may be provided to the communication interface 60 via various communication modes now-known or later-developed, such as, e.g., physical data ports, Bluetooth, LAN/WAN (wireless or wired (e.g., Ethernet, cable, etc.)), cellular connection, satellite connection, etc. Software and firmware updates may be downloaded and installed via the communication interface 60.

Component data database 120 may store various data associated with the components being managed by the component life prediction and maintenance system 100. For example, in the case of aircraft components, the component data database 120 may store, for each component, flight schedules of aircraft(s) in which the component has been installed, environmental data (e.g., weather), operational data (e.g., run hours), a date of installation, a date of failure, a root cause of failure, etc. Notably, the component data database 120 may store component-related data received or retrieved from off-board sources, such as, e.g., airport databases, national weather service (NWS) databases, etc. However, in other embodiments, the information sources may not be limited to off-board sources and may also include on-board sources, such as, e.g., flight management system, on-board environmental system, sensor data storage, etc. The component data database 120 may be implemented in a computer or a server (e.g., cloud) that is capable of collecting component-related data from the various types of source systems. In other words, the component data database 120 may act as a centralized data storage location for component-related data. In some embodiments, although FIG. 1 shows a single component data database 120, multiple component data databases may reside within the component life prediction and maintenance system 100 in a distributed manner. In such a case, the component life prediction system 110 may be configured to exchange data with the multiple component data databases using the communication interface 60. In other embodiments, the component data database 120 may not be present, and the component life prediction system 110 may receive component-related data directly from the various information sources, such as, e.g., airport databases, national weather service (NWS) databases, etc.

It should be noted that the context to which the disclosed embodiments may be applicable is not limited to aircrafts specifically discussed herein. Rather, it would be obvious to one of ordinary skill in the pertinent art that the disclosed embodiments may be applicable to many contexts, including but not limited to aircrafts, motor vehicles (e.g., motorcycles, cars, trucks, buses, etc.), railed vehicles (e.g., trains, trams, subways, etc.), watercraft (e.g., ships, boats, yachts, etc.), spacecraft, and any other vehicles or moving machines. Therefore, the exemplary embodiments of the current disclosure may not be limited to any specific vehicle type, but may also be integrated with machines, systems, components, or any other environments or contexts in which the aforementioned need may exist.

Component maintenance system 130 may be remotely located from the component life prediction system 110, and may receive processed data (e.g., remaining useful lives of components) from the component life prediction system 110 via various communication modes (e.g., physical data ports, Bluetooth, LAN/WAN (wireless or wired (e.g., Ethernet, cable, etc.)), cellular connection, satellite connection, etc.). The component maintenance system 130 may further process the received data to schedule maintenance tasks. For example, the component maintenance system 130 may receive a remaining useful life of a component, and based on the remaining useful life, modify or update the maintenance schedule of the component. Further, the component maintenance system 130 may send notifications to appropriate maintenance personnel based on the updated maintenance schedule. A notification sent to a maintenance technician may indicate one or more scheduled maintenance tasks associated with the component and the corresponding times/dates, and may request the maintenance technician to confirm, decline, or reschedule the maintenance tasks. However, the component maintenance system 130 may not allow the maintenance technician to reschedule for a date/time that goes past the determined remaining useful life of the component. For example, based on the remaining useful lives of components, the component maintenance system 130 may set deadlines by which the scheduled maintenance tasks must be completed, and may generate further alerts/notifications to the maintenance technicians as the deadlines approach. If a maintenance technician receiving a notification declines to perform the indicated maintenance task, the component maintenance system 130 may find another maintenance technician suited for the task and send the notification accordingly. The component maintenance system 130 may also allow the receiving maintenance technician to delegate the scheduled maintenance task to another maintenance technician. In some embodiments, the component maintenance system 130 may be a terminal or kiosk located in a repair or maintenance facility, and may directly present (instead of sending notifications to maintenance personnel) the updated maintenance schedule and the corresponding maintenance tasks to a user via a display, and may allow the user to perform the operations discussed above (e.g., confirm, decline, delegate, or reschedule maintenance tasks).

In addition to providing notifications to maintenance personnel, the component maintenance system 130 may also be configured to provide notifications to repair parts vendor systems based on the scheduled maintenance tasks. A notification sent to a repair parts vendor system may indicate one or more repair parts needed for the scheduled maintenance tasks, and the time/date by which the repair parts must be delivered to the repair facilities associated with the scheduled maintenance tasks. The notification may enable the repair parts vendor system to confirm or decline the repair parts delivery request. Furthermore, the component maintenance system 130 may generate additional notifications or alerts to the repair parts vendor system if a response is not received within a predetermined time. For instance, another notification may be sent to the repair parts vendor if no confirmation or declination is received within, for example, 3 days. The additional notifications or alerts may continue to be sent to the repair parts vendor system until a predetermined period of time remains before the corresponding scheduled maintenance task. In other words, the component management system 130 may discontinue the additional notifications or alerts at a point at which the predetermined period of time does not remain before the corresponding scheduled maintenance task, search for another suitable repair parts vendor system, and send notification(s) to the newly-found repair parts vendor system.

It should be noted that, although the component life prediction system 110 and the component maintenance system 130 are depicted as separate systems/devices in FIG. 1, the component life prediction system 110 and the component maintenance system 130 may be implemented as a single system/device. For instance, systems 110 and 130 may be implemented in a computing device comprising one or more processors, a volatile and a nonvolatile storage, an input/output interface, a communication interface, and a remaining useful life determination module and a maintenance schedule update module stored on the nonvolatile storage.

Figure 2:
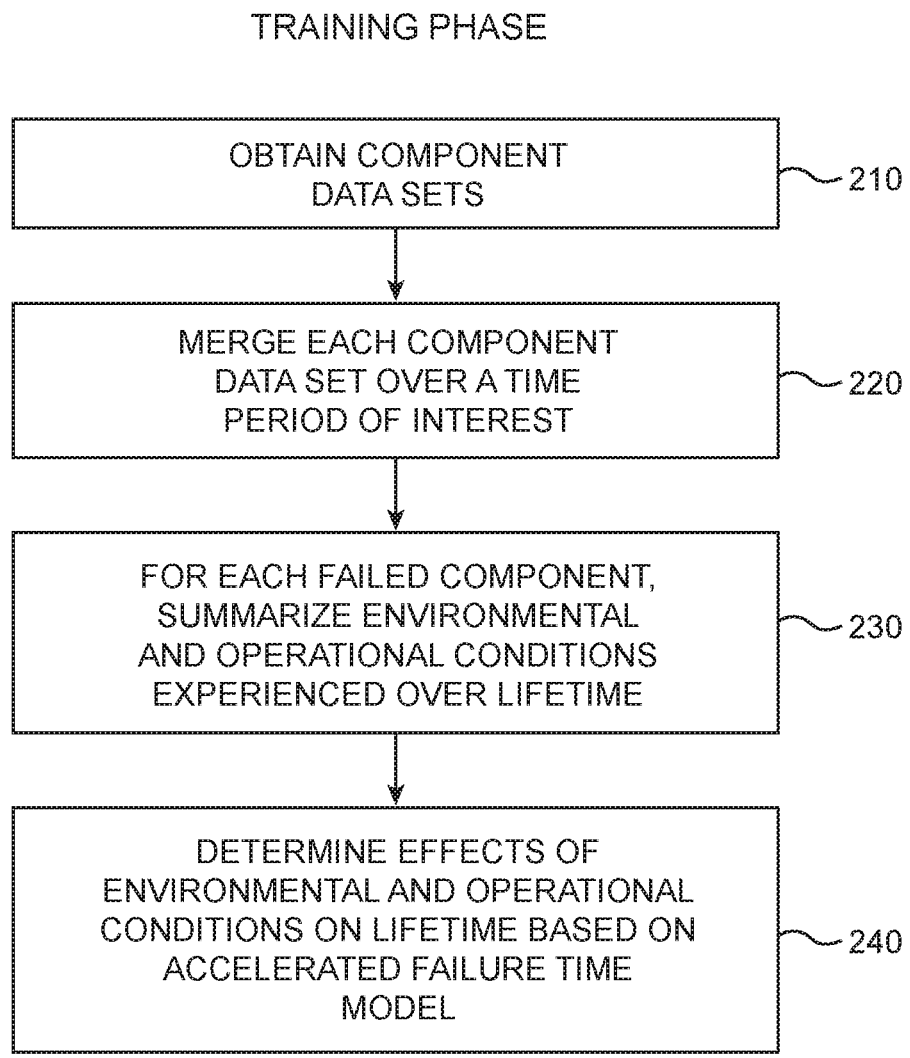
FIG. 2 is a flowchart illustrating an exemplary method of determining environmental and operational effects on a component's lifetime, according to one implementation of the current disclosure.

FIG. 2 is a flowchart illustrating an exemplary method of determining environmental and operational effects on a component's lifetime, using the remaining useful life determination module 10 of the current disclosure (i.e., training phase). At step 210, the component life prediction system 110 may obtain component data sets from the component data database 120. As discussed above with reference to FIG. 1, the component life prediction system 110 may receive the component data sets from the component data database 120 via the communication interface 60. The received component data sets may first be stored in the nonvolatile storage 40 and later loaded onto the volatile storage 30 to be processed by the processor 20 executing the remaining useful life determination module 10. Each component data set may comprise various types of data associated with the corresponding component, such as, e.g., flight schedules of one or more aircrafts in which the component has been installed, environmental conditions that the component has experienced (e.g., wind, wind speed, rain, snow, temperature, altitude, speed of the aircraft, etc.), operational conditions that the component has experienced (e.g., total run hours, average continuous run hours, power consumed, etc.), a date of installation, a date of failure, a root cause of failure, etc.

At step 220, the remaining useful life determination module 10 may merge each component data set corresponding to a respective component over one or more time periods of interest, such as, e.g., duration of each flight. More particularly, using the received flight schedules corresponding to the component, the remaining useful life determination module 10 may determine the environmental conditions that the component experienced during each flight (e.g., wind, rain, snow, temperature, altitude, and/or speed of the aircraft experienced by the component during each flight), and the operational conditions that the component experienced during each flight (e.g., total run hours, average continuous run hours, and/or power consumed by the component during each flight). In other words, the remaining useful life determination module 10 may determine the environmental and the operation conditions that the component experienced or accumulated during each flight.

At step 230, the remaining useful life determination module 10 may summarize, for each failed component, the environment and operational conditions experienced over the lifetime of the failed component, based on the component data set merged over the time period(s) of interest in step 220. The summarization may involve establishing an average, maximum, minimum, or any other statistical aggregate of the various environmental and operational conditions experienced by the failed component in the failed component's operating region, and parameterizing other environmental and operational conditions experienced by the failed component.

At step 240, the remaining useful life determination module 10 may determine the effects of the environmental and operational conditions on the lifetime of each component of interest, by building an Accelerated Failure Time (AFT) model using the time variables and the summarized environmental and operational factors associated with the corresponding failed component obtained in step 230. AFT model may be specified as:

$$\lambda(t|\theta) = \theta\lambda_0(\theta t)$$

where $\theta = e^{(-[\beta_0 X_0 + \ldots + \beta_n X_n])}$ $\lambda$ refers to the hazard function of the component lifetime, $\theta$ refers to the covariate (i.e., a measure of the severity of the environmental and operational effects), and t refers to time. The X variables in the covariate $\theta$ refer to the environmental and operational factors, which influence the lifetime of the component. $\beta$ coefficients are weights that determine the degree to which each environmental or operational factor influences the life of the component.

Using the time variables and the summarized (i.e., parameterized) environmental and operational factors obtained for the failed components as training data, the AFT model for each component of interest may be trained until the values of the learned variables do not change substantially using common estimators such as the maximum likelihood estimation. Particularly, the $\beta$ coefficients are estimated using the time variables (i.e., plugged into t) and the summarized environmental and operational factors (i.e., plugged into X).

Figure 3:
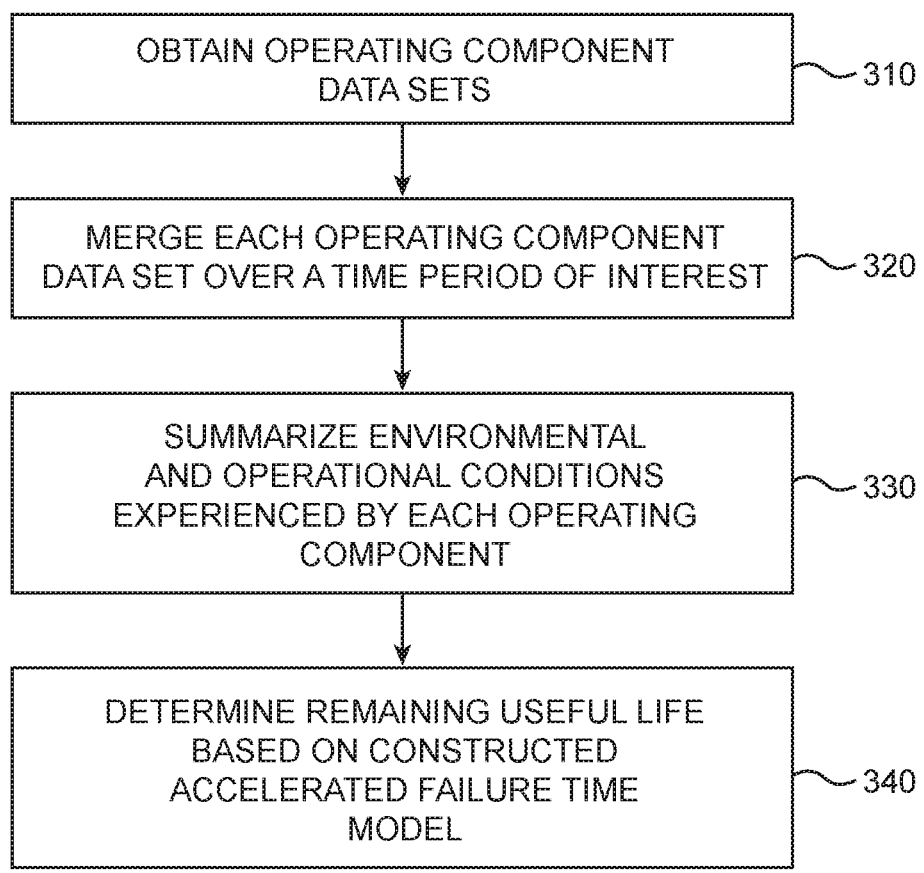
FIG. 3 is a flowchart illustrating an exemplary method of determining a remaining useful life of a component, according to one implementation of the current disclosure.

FIG. 3 is a flowchart illustrating an exemplary method of determining a remaining useful life of a component based on the AFT model constructed via the training phase illustrated in FIG. 2 (i.e., estimation phase). At step 310, the remaining useful life determination module 10 may obtain component data sets corresponding to operating components ("operating component data sets" hereafter). As discussed above with reference to FIG. 1, the component life prediction system 110 may receive the operating component data sets from the component data database 120 via the communication interface 60. The received operating component data sets may first be stored in the nonvolatile storage 40 and later loaded onto the volatile storage 30 to be processed by the processor 20 executing the remaining useful life determination module 10. Each operating component data set may comprise various types of data associated with the corresponding operating component, such as, e.g., flight schedules of one or more aircrafts in which the operating component has been installed, environmental conditions that the operating component has experienced (e.g., wind, wind speed, rain, snow, temperature, altitude, speed of the aircraft, etc.), operational conditions that the operating component has experienced (e.g., total run hours, average continuous run hours, power consumed, etc.), a date of installation, a date of failure, a root cause of failure, etc.

At step 320, the remaining useful life determination module 10 may merge each operating component data set corresponding to a respective operating component over one or more time periods of interest, such as, e.g., duration of each flight. More particularly, using the received flight schedules corresponding to the operating component, the remaining useful life determination module 10 may determine the environmental conditions that the operating component experienced during each flight (e.g., wind, rain, snow, temperature, altitude, and/or speed of the aircraft experienced by the operating component during each flight), and the operational conditions that the operating component experienced during each flight (e.g., total run hours, average continuous run hours, and/or power consumed by the operating component during each flight). In other words, the remaining useful life determination module 10 may determine the environmental and the operation conditions that the operating component experienced or accumulated during each flight.

At step 330, the remaining useful life determination module 10 may summarize, for each operating component, the environment and operational conditions experienced by the operating component, based on the operating component data set merged over the time period(s) of interest in step 320. The summarization may involve establishing an average, maximum, and minimum temperature experienced by the operating component in the component's operating region, and parameterizing other environmental conditions experienced by the operating component (e.g., wind, wind speed, rain, snow, altitude, speed of the aircraft, etc.).

At step 340, the remaining useful life determination module 10 may determine the remaining useful life of each operating component, by using the corresponding Accelerated Failure Time (AFT) model (i.e., AFT model constructed for the operating component) via the training phase illustrated in FIG. 2. With the estimated β coefficients available in the AFT model, the time variables and the summarized (i.e., parameterized) environmental and operational factors obtained for the operating component may be applied to the AFT model to determine the remaining useful life of the operating component.

Figure 4:
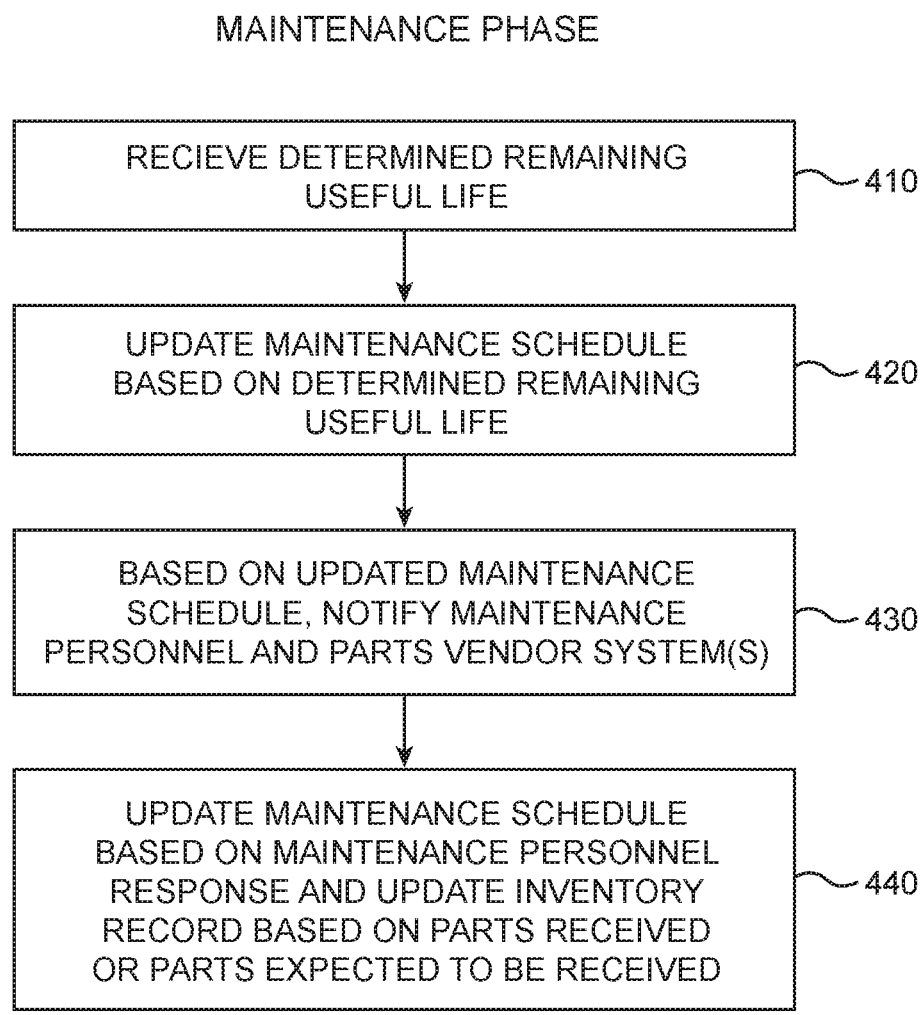
FIG. 4 is a flowchart illustrating an exemplary method of facilitating maintenance operations based on the determined remaining useful life of components, according to one implementation of the current disclosure.

FIG. 4 is a flowchart illustrating an exemplary method of facilitating maintenance operations, based on the remaining useful life of components determined in the estimation phase illustrated in FIG. 3 (i.e., maintenance phase). At step 410, the component maintenance system 130 may receive the remaining useful life value(s) determined for the operating component(s) of interest. At step 420, the component maintenance system 130 may update (or newly generate) the maintenance schedule(s) corresponding to the operating component(s) of interest based on the received remaining useful life value(s). For example, if a pre-existing maintenance schedule for a component indicates that a maintenance activity is scheduled in one month but the received remaining useful life for the component indicates just two weeks of useful life remaining, the maintenance schedule is updated so that the maintenance activity is scheduled within two weeks. In some embodiments, a safety time period may be specified for each component of interest, such that the component of interest may be scheduled for maintenance at least a safety time period in advance of the projected component failure time. For example, if a safety time period of 28 days (4 weeks) is specified and the determined remaining useful life is 49 days (7 weeks) for a component, a maintenance activity for the component may be scheduled within 21 days (3 weeks) (i.e., maintenance activity cutoff date/time=remaining useful life−safety time period).

At step 430, the component maintenance system 130 may notify appropriate maintenance personnel based on the updated maintenance schedule, and may also notify appropriate parts vendor systems to provide repair parts to the repair facilities assigned to the scheduled maintenance activities. As discussed above with reference to FIG. 1, the notifications may enable the recipient maintenance technicians to confirm, decline, or reschedule the scheduled maintenance activities, or delegate the scheduled maintenance activities to another maintenance technician. The notification may also enable the recipient parts vendor systems to confirm or decline the repair parts delivery. If the repair parts delivery is declined, the component maintenance system 130 may search for another repair parts vendor system and send a notification to the repair parts vendor system. This search-and-notify process may be iteratively performed until a repair parts vendor system confirms the repair parts delivery. At step 440, the component maintenance system 130 may further update the maintenance schedules based on the responses received from the maintenance technicians (e.g., confirmation, declination, rescheduling, or delegation), and may also update the parts inventory record based on the parts received or parts expected to be received from the repair parts vendor systems.

Embodiments of the present disclosure concerning vehicle component remaining useful life prediction addresses the drawbacks of the prior approaches, using some of the techniques discussed above. In general, the embodiments of the present disclosure have at least the following distinguishable features that lead to significant technical improvements:

1) accurate prediction of remaining useful life based on environmental and operational conditions, without relying on sensor data and sensors attached to individual vehicle components;

2) predictive vehicle component maintenance, preventing component failures and consequential events;

3) condition-based vehicle component maintenance, minimizing parts cost, system downtime, and time spent on maintenance; and 4) increased safety for personnel working on critical or dangerous equipment.

Unless specifically stated otherwise, as apparent from the following discussions, it is appreciated that throughout the specification discussions utilizing terms such as "processing," "computing," "calculating," "determining", analyzing" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Figure 5:
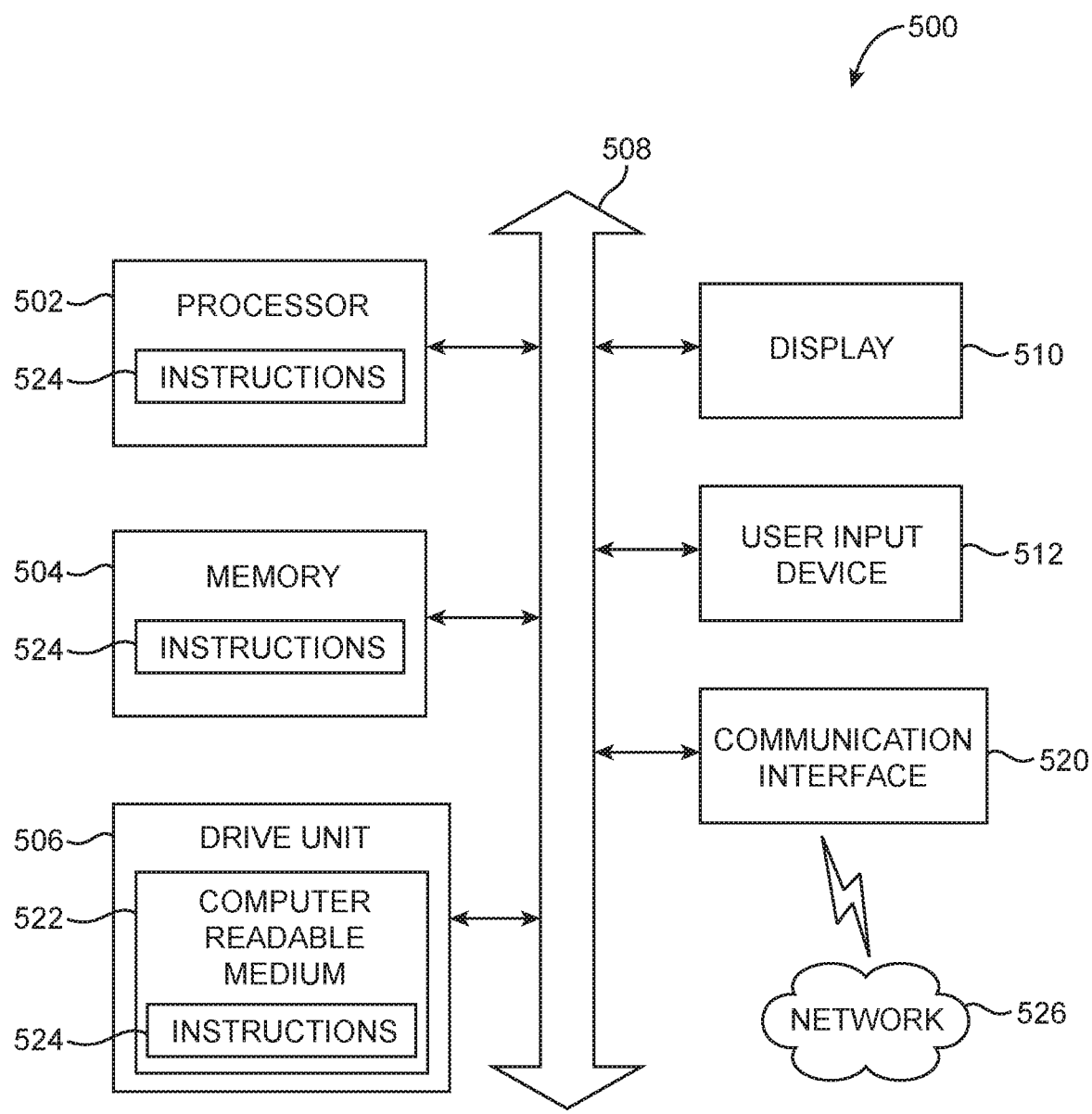
FIG. 5 illustrates an implementation of a computer system, according to one implementation of the current disclosure.

FIG. 5 illustrates an implementation of a general computer system designated 500. The computer system 500 can include a set of instructions that can be executed to cause the computer system 500 to perform any one or more of the methods or computer based functions disclosed herein. The computer system 500 may operate as a standalone device or may be connected, e.g., using a network, to other computer systems or peripheral devices.

In a networked deployment, the computer system 500 may operate in the capacity of a server or as a client user computer in a server-client user network environment, or as a peer computer system in a peer-to-peer (or distributed) network environment. The computer system 500 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the computer system 500 can be implemented using electronic devices that provide voice, video, or data communication. Further, while a single computer system 500 is illustrated, the term "system" shall also be taken to include any collection of systems or sub-systems that individually or jointly execute a set, or multiple sets, of instructions to perform one or more computer functions.

As illustrated in FIG. 5, the computer system 500 may include a processor 502, e.g., a central processing unit (CPU), a graphics processing unit (GPU), or both. The processor 502 may be a component in a variety of systems. For example, the processor 502 may be part of a standard personal computer or a workstation. The processor 502 may be one or more general processors, digital signal processors, application specific integrated circuits, field programmable gate arrays, servers, networks, digital circuits, analog circuits, combinations thereof, or other now known or later developed devices for analyzing and processing data. The processor 502 may implement a software program, such as code generated manually (i.e., programmed).

The computer system 500 may include a memory 504 that can communicate via a bus 508. The memory 504 may be a main memory, a static memory, or a dynamic memory. The memory 504 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 504 includes a cache or random-access memory for the processor 502. In alternative implementations, the memory 504 is separate from the processor 502, such as a cache memory of a processor, the system memory, or other memory. The memory 504 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 504 is operable to store instructions executable by the processor 502. The functions, acts or tasks illustrated in the figures or described herein may be performed by the programmed processor 502 executing the instructions stored in the memory 504. The functions, acts or tasks are independent of the particular type of instructions set, storage media, processor or processing strategy and may be performed by software, hardware, integrated circuits, firm-ware, microcode and the like, operating alone or in combination. Likewise, processing strategies may include multiprocessing, multitasking, parallel processing and the like.

As shown, the computer system 500 may further include a display unit 510, such as a liquid crystal display (LCD), an organic light emitting diode (OLED), a flat panel display, a solid-state display, a cathode ray tube (CRT), a projector, a printer or other now known or later developed display device for outputting determined information. The display 510 may act as an interface for the user to see the functioning of the processor 502, or specifically as an interface with the software stored in the memory 504 or in the drive unit 506.

Additionally or alternatively, the computer system 500 may include an input device 512 configured to allow a user to interact with any of the components of system 500. The input device 512 may be a number pad, a keyboard, or a cursor control device, such as a mouse, or a joystick, touch screen display, remote control, or any other device operative to interact with the computer system 500.

The computer system 500 may also or alternatively include a disk or optical drive unit 506. The disk drive unit 506 may include a computer-readable medium 522 in which one or more sets of instructions 524, e.g. software, can be embedded. Further, the instructions 524 may embody one or more of the methods or logic as described herein. The instructions 524 may reside completely or partially within the memory 504 and/or within the processor 502 during execution by the computer system 500. The memory 504 and the processor 502 also may include computer-readable media as discussed above.

In some systems, a computer-readable medium 522 includes instructions 524 or receives and executes instructions 524 responsive to a propagated signal so that a device connected to a network 526 can communicate voice, video, audio, images, or any other data over the network 526. Further, the instructions 524 may be transmitted or received over the network 526 via a communication port or interface 520, and/or using a bus 508. The communication port or interface 520 may be a part of the processor 502 or may be a separate component. The communication port 520 may be created in software or may be a physical connection in hardware. The communication port 520 may be configured to connect with a network 526, external media, the display 510, or any other components in system 500, or combinations thereof. The connection with the network 526 may be a physical connection, such as a wired Ethernet connection or may be established wirelessly as discussed below. Likewise, the additional connections with other components of the system 500 may be physical connections or may be established wirelessly. The network 526 may alternatively be directly connected to the bus 508.

While the computer-readable medium 522 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 522 may be non-transitory, and may be tangible.

The computer-readable medium 522 can include a solid-state memory such as a memory card or other package that houses one or more non-volatile read-only memories. The computer-readable medium 522 can be a random-access memory or other volatile re-writable memory. Additionally or alternatively, the computer-readable medium 522 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The computer system 500 may be connected to one or more networks 1026. The network 526 may define one or more networks including wired or wireless networks. The wireless network may be a cellular telephone network, an 802.11, 802.16, 802.20, or WiMax network. Further, such networks may include a public network, such as the Internet, a private network, such as an intranet, or combinations thereof, and may utilize a variety of networking protocols now available or later developed including, but not limited to TCP/IP based networking protocols. The network 526 may include wide area networks (WAN), such as the Internet, local area networks (LAN), campus area networks, metropolitan area networks, a direct connection such as through a Universal Serial Bus (USB) port, or any other networks that may allow for data communication. The network 526 may be configured to couple one computing device to another computing device to enable communication of data between the devices. The network 526 may generally be enabled to employ any form of machine-readable media for communicating information from one device to another. The network 526 may include communication methods by which information may travel between computing devices. The network 526 may be divided into sub-networks. The sub-networks may allow access to all of the other components connected thereto or the sub-networks may restrict access between the components. The network 526 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component/object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the steps of methods discussed are performed in one embodiment by an appropriate processor (or processors) of a processing (i.e., computer) system executing instructions (computer-readable code) stored in storage. It will also be understood that the invention is not limited to any particular implementation or programming technique and that the invention may be implemented using any appropriate techniques for implementing the functionality described herein. The invention is not limited to any particular programming language or operating system.

It should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as falling within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

The above disclosed subject matter is to be considered illustrative, and not restrictive, and the appended claims are intended to cover all such modifications, enhancements, and other implementations, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description. While various implementations of the disclosure have been described, it will be apparent to those of ordinary skill in the art that many more implementations and implementations are possible within the scope of the disclosure. Accordingly, the disclosure is not to be restricted except in light of the attached claims and their equivalents.

What is claimed is:

1. A computer-implemented method of predicting a remaining useful life of a component, the method comprising:
   receiving, by a component life prediction system, a first component data set associated with a failed component of a moving object from a component data database configured to store environmental conditions and operational conditions of the moving object, wherein the environmental conditions comprise at least one of wind speed, wind, rain, snow, temperature, altitude, and speed of the moving object, and wherein the operational conditions comprise at least one of total run hours, average continuous run time, and power consumed;
   determining, by the component life prediction system, effects of the environmental conditions and the operational conditions on a lifetime of the failed component by constructing an accelerated failure time model, wherein the accelerated failure time model is constructed based on time variables, the environmental conditions and the operational conditions of the failed component;
   receiving, by the component life prediction system, a second component data set associated with an operating component of the moving object from the component data database;
   determining, by the component life prediction system, a remaining useful life of the operating component based on applying the environmental conditions and the operational conditions of the second component data set into the accelerated failure time model;
   updating, by the component life prediction system, a maintenance schedule of the operating component based on the determined remaining useful life; and
   transmitting, by the component life prediction system, a first notification indicating the updated maintenance schedule of the operating component.

2. The computer-implemented method of claim 1, wherein the first component data set comprises: travel schedules, environmental data, operational data, a date of installation, a date of failure, and/or a root cause of failure associated with the component of an aircraft.

3. The computer-implemented method of claim 1, further comprising, generating a summary based on the environmental conditions, and the operational conditions of the failed component and the operating component, respectively, wherein the summary for failed component is indicative of training data and wherein the summary is generated by:
   determining an average temperature, a maximum temperature, and a minimum temperature experienced by the failed component and the operating component, respectively; and
   parameterizing the environmental and operational conditions experienced by the failed component and the operating component, respectively in their lifetime.

4. The computer-implemented method of claim 1, further comprising:
   transmitting, by the component life prediction system, the first notification to a maintenance technician; and
   transmitting, by the component life prediction system, a second notification indicating one or more repair parts and a date by which the one or more repair parts must be delivered to a repair facility.

5. The computer-implemented method of claim 3, generating the summary based on the environmental conditions and the operational conditions experienced over the lifetime of the failed component comprises:
   merging, by the component life prediction system, the first component data set with one or more additional component data sets over one or more time periods of interest.

6. The computer-implemented method of claim 5, wherein the merging, by the component life prediction system, the first component data set with the one or more additional component data sets over one or more time periods of interest comprises:
   determining environmental conditions and operational conditions that a corresponding component experienced during each time period of interest, wherein the time period of interest is a travel duration.

7. The computer-implemented method of claim 1, further comprising training the accelerated failure time model using the environmental conditions and the operational conditions of the first component data set to determine effects of the environmental conditions and the operational conditions on the lifetime of the operating component.

8. A system for predicting a remaining useful life of a component, the system comprising:
   one or more processors; and
   a non-transitory computer readable medium storing instructions that, when executed by the one or more processors, cause the one or more processors to perform a method of predicting a remaining useful life of a component, the method comprising:
   receiving, by a component life prediction system, a first component data set associated with a failed component of a moving object from a component data database configured to store environmental conditions and operational conditions of the moving object, wherein the environmental conditions comprise at least one of wind speed, wind, rain, snow, temperature, altitude, and speed of the moving object, and wherein the operational conditions comprise at least one of total run hours, average continuous run time, and power consumed;
   determining, by the component life prediction system, effects of the environmental conditions and the operational conditions on a lifetime of the failed component by constructing an accelerated failure time model, wherein the accelerated failure time model is constructed based on time variables, the environmental conditions and the operational conditions of the failed component;
   receiving, by the component life prediction system, a second component data set associated with an operating component of the moving object from the component data database;
   determining, by the component life prediction system, a remaining useful life of the operating component based on applying the environmental conditions and the operational conditions of the second component data set into the accelerated failure time model;
   updating, by the component life prediction system, a maintenance schedule of the operating component based on the determined remaining useful life; and
   transmitting, by the component life prediction system, a first notification indicating the updated maintenance schedule of the operating component.

9. The system of claim 8, wherein the first component data set comprises: travel schedules, environmental data, operational data, a date of installation, a date of failure, and/or a root cause of failure associated with the component of an aircraft.

10. The system of claim 8, further comprising generating a summary based on the environmental conditions, and the operational conditions of the failed component and the operating component, respectively, wherein the summary for failed component is indicative of training data and wherein the summary is generated by:
   determining an average temperature, a maximum temperature, and a minimum temperature experienced by the failed component and the operating component, respectively; and
   parameterizing the environmental conditions and the operational conditions experienced by the failed component and the operating component, respectively in their lifetime.

11. The system of claim 8, further comprising:
   transmitting, by the component life prediction system, the first notification to a maintenance technician; and
   transmitting, by the component life prediction system, a second notification indicating one or more repair parts and a date by which the one or more repair parts must be delivered to a repair facility.

12. The system of claim 10, wherein the generating the summary based on the environmental conditions and the operational conditions experienced over the lifetime of the failed component comprises:
   merging, by the component life prediction system, the first component data set with one or more additional component data sets over one or more time periods of interest.

13. The system of claim 12, wherein the merging, by the component life prediction system, the first component data set with the one or more additional component data sets over one or more time periods of interest comprises: determining environmental conditions and operational conditions that a corresponding component experienced during each time period of interest, wherein the time period of interest is a travel duration.

14. The system of claim 8, further comprising training the accelerated failure time model using the environmental conditions and the operational conditions of the first component data set to determine effects of the environmental conditions and the operational conditions on the lifetime of the operating component.

15. A non-transitory computer readable medium storing instructions that, when executed by one or more processors, cause the one or more processors to perform a method of predicting a remaining useful life of a component comprising:
   receiving, by a component life prediction system, a first component data set associated with a failed component of a moving object from a component data database configured to store environmental conditions and operational conditions of the moving object, wherein the environmental conditions comprise at least one of wind speed, wind, rain, snow, temperature, altitude, and speed of the moving object, and wherein the operational conditions comprise at least one of total run hours, average continuous run time, and power consumed;
   determining, by the component life prediction system, effects of the environmental conditions and the operational conditions on a lifetime of the failed component by constructing an accelerated failure time model, wherein the accelerated failure time model is constructed based on time variables, the environmental conditions and the operational conditions of the failed component;
   receiving, by the component life prediction system, a second component data set associated with an operating component of the moving object from the component data database;
   determining, by the component life prediction system, a remaining useful life of the operating component based on applying the environmental conditions and the operational conditions of the second component data set into the accelerated failure time model;
   updating, by the component life prediction system, a maintenance schedule of the operating component based on the determined remaining useful life; and
   transmitting, by the component life prediction system, a first notification indicating the updated maintenance schedule of the operating component.

16. The non-transitory computer readable medium of claim 15, further comprising:
   transmitting, by the component life prediction system, the first notification to a maintenance technician; and
   transmitting, by the component life prediction system, a second notification indicating one or more repair parts and a date by which the one or more repair parts must be delivered to a repair facility.

17. The non-transitory computer readable medium of claim 15, further comprising, generating a summary based on the environmental conditions and the operational conditions of the failed component and the operating component, respectively, wherein the summary for failed component is indicative of training data and wherein the summary is generated by:
   determining an average temperature, a maximum temperature, and a minimum temperature experienced by the failed component and the operating component, respectively; and
   parameterizing the environmental and operational conditions experienced by the failed component and the operating component, respectively in their lifetime.

18. The non-transitory computer readable medium of claim 17, generating the summary based on the environmental conditions and the operational conditions experienced over the lifetime of the failed component comprises:
   merging, by the component life prediction system, the first component data set with one or more additional component data sets over one or more time periods of interest.

19. The non-transitory computer readable medium of claim 18, wherein the merging, by the component life prediction system, the first component data set with the one or more additional component data sets over one or more time periods of interest comprises:
   determining environmental conditions and operational conditions that a corresponding component experienced during each time period of interest, wherein the time period of interest is a travel duration.

20. The non-transitory computer readable medium of claim 15, further comprising training the accelerated failure time model using the environmental conditions and the operational conditions of the first component data set to determine effects of the environmental conditions and the operational conditions on the lifetime of the operating component.

* * * * *